United States Patent
Lee et al.

(10) Patent No.: US 9,315,606 B2
(45) Date of Patent: Apr. 19, 2016

(54) PHOTOCURABLE COMPOSITION AND ENCAPSULATED APPARATUS PREPARED USING THE SAME

(71) Applicant: Samsung SDI Co., Ltd., Yongin-si, Gyeonggi-do (KR)

(72) Inventors: Ji Yeon Lee, Uiwang-si (KR); Sung Min Ko, Uiwang-si (KR); Seong Ryong Nam, Uiwang-si (KR); Se Il Oh, Uiwang-si (KR); Seung Jib Choi, Uiwang-si (KR); Kyoung Jin Ha, Uiwang-si (KR)

(73) Assignee: SAMSUNG SDI CO., LTD., Yongin-si, Gyeonggi-do (KR)

( * ) Notice: Subject to any disclaimer, the term of this patent is extended or adjusted under 35 U.S.C. 154(b) by 0 days.

(21) Appl. No.: 14/336,234

(22) Filed: Jul. 21, 2014

(65) Prior Publication Data

US 2015/0048334 A1  Feb. 19, 2015

(30) Foreign Application Priority Data

Aug. 13, 2013  (KR) .......................... 10-2013-0095724

(51) Int. Cl.
| | | |
|---|---|---|
| *C08F 220/20* | (2006.01) | |
| *H01L 51/00* | (2006.01) | |
| *C08F 222/20* | (2006.01) | |

(Continued)

(52) U.S. Cl.
CPC ................. *C08F 222/20* (2013.01); *C08F 2/48* (2013.01); *C08F 230/02* (2013.01); *C08F 230/08* (2013.01); *H01L 51/0043* (2013.01); *H01L 51/5253* (2013.01); *H01L 33/56* (2013.01); *H01L 51/5237* (2013.01)

(58) Field of Classification Search
CPC ... H01L 51/5237; H01L 33/52; C08F 230/02; C08F 230/08
USPC .................................................. 526/274, 279
See application file for complete search history.

(56) References Cited

U.S. PATENT DOCUMENTS 8,679,636 B2 * 3/2014 Iyer et al. .................. 428/463
2010/0148666 A1 * 6/2010 Liu et al. ................... 313/512

(Continued)

FOREIGN PATENT DOCUMENTS

| EP | 2573854 A1 | 3/2013 |
|---|---|---|
| KR | 10-2005-0021054 A | 3/2005 |

OTHER PUBLICATIONS

Extended European Search Report for 14177801.9 dated Mar. 19, 2015; Lee, et al.

*Primary Examiner* — Vu A Nguyen
(74) *Attorney, Agent, or Firm* — Lee & Morse, P.C.

(57) ABSTRACT

A photocurable composition, a composition for encapsulation of an organic light emitting diode, and an encapsulated apparatus, wherein, in the photocurable composition, when A represents a glass-metal alloy die shear strength in kgf between a glass substrate and a Ni/Fe alloy after curing, and B represents curing shrinkage in % as determined by Equation 1, below, and the photocurable composition has a value for A/B of about 0.7 kgf/% or more and the glass-metal alloy die shear strength of about 2.5 kgf or more, Curing shrinkage=|(Specific gravity of solid photocurable composition after curing)−(Specific gravity of liquid photocurable composition before curing)|/(Specific gravity of liquid photocurable composition before curing)×100.  <Equation 1>

20 Claims, 2 Drawing Sheets

(51) Int. Cl.
  *C08F 2/48* (2006.01)
  *C08F 230/02* (2006.01)
  *C08F 230/08* (2006.01)
  *H01L 51/52* (2006.01)
  *H01L 33/56* (2010.01)

(56) References Cited

U.S. PATENT DOCUMENTS

2013/0328028 A1* 12/2013 Lee et al. ............... 257/40
2014/0106111 A1* 4/2014 Nam et al. ............... 428/76

* cited by examiner

PHOTOCURABLE COMPOSITION AND ENCAPSULATED APPARATUS PREPARED USING THE SAME

CROSS-REFERENCE TO RELATED APPLICATION

Korean Patent Application No. 10-2013-0095724, filed on Aug. 13, 2013, in the Korean Intellectual Property Office, and entitled: "Photocurable Composition and Encapsulated Apparatus Prepared Using The Same," is incorporated by reference herein in its entirety.

BACKGROUND

1. Field

Embodiments relate to a photocurable composition and an encapsulated apparatus prepared using the same.

2. Description of the Related Art

An organic light emitting diode (OLED) may have a structure in which a functional organic layer is interposed between an anode and a cathode, and a high-energy exciton is created by recombination of holes injected into the cathode and electrons injected into the anode. The created exciton moves back to a ground state, thereby emitting light within a specific wavelength band. Organic light emitting diodes may have merits such as self-luminescence, rapid response time, wide viewing angle, ultra-thin thickness, high image quality, and durability.

SUMMARY

Embodiments are directed to a photocurable composition and an encapsulated apparatus prepared using the same.

The embodiments may be realized by providing a photocurable composition, wherein, when A represents a glass-metal alloy die shear strength in kgf between a glass substrate and a Ni/Fe alloy after curing, and B represents a curing shrinkage in % as determined by Equation 1, below, the photocurable composition has a value for A/B of about 0.7 kgf/% or more and the glass-metal alloy die shear strength is about 2.5 kgf or more, Curing shrinkage=|(Specific gravity of solid photocurable composition after curing)−(Specific gravity of liquid photocurable composition before curing)|/(Specific gravity of liquid photocurable composition before curing)×100. <Equation 1>

The photocurable composition may have a curing shrinkage of about 1% to about 10%.

The photocurable composition may include a first photocurable monomer, the first photocurable monomer containing phosphorus and silicon; a second photocurable monomer, the second photocurable monomer being free of phosphorus and silicon, and containing an aromatic group; and a third photocurable monomer, the third photocurable monomer being free of phosphorus, silicon, and an aromatic group.

The first photocurable monomer may be represented by Formula 1:

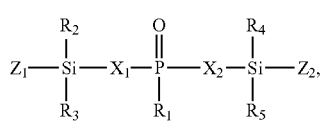

wherein, in Formula 1, $X_1$ and $X_2$ are each independently oxygen, sulfur, or —NR—, in which R is hydrogen or a $C_1$ to $C_{10}$ alkyl group; $R_1$, $R_2$, $R_3$, $R_4$ and $R_5$ are each independently a substituted or unsubstituted $C_1$ to $C_{10}$ alkyl group, a substituted or unsubstituted $C_6$ to $C_{20}$ aryl group, a substituted or unsubstituted $C_3$ to $C_{10}$ cycloalkyl group, or a substituted or unsubstituted $C_7$ to $C_{21}$ arylalkyl group; $Z_1$ and $Z_2$ are each independently hydrogen, a substituted or unsubstituted $C_1$ to $C_{10}$ alkyl group, a substituted or unsubstituted $C_6$ to $C_{20}$ aryl group, a substituted or unsubstituted $C_3$ to $C_{10}$ cycloalkyl group, a substituted or unsubstituted $C_7$ to $C_{21}$ arylalkyl group, or a group represented by Formula 2:

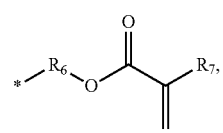

wherein, in Formula 2, "*" represents a binding site to a silicon atom of Formula 1, $R_6$ is a substituted or unsubstituted $C_1$ to $C_{10}$ alkylene group, a substituted or unsubstituted $C_6$ to $C_{20}$ arylene group, a substituted or unsubstituted $C_3$ to $C_{10}$ cycloalkylene group or a substituted or unsubstituted $C_7$ to $C_{21}$ arylalkylene group, and $R_7$ is hydrogen, or a methyl group; and at least one of $Z_1$ and $Z_2$ is the group represented by Formula 2.

The second photocurable monomer may be represented by Formula 5:

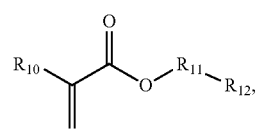

wherein, in Formula 5, $R_{10}$ is hydrogen or a methyl group; $R_{11}$ is a substituted or unsubstituted $C_1$ to $C_{10}$ aliphatic hydrocarbon group; and $R_{12}$ is a substituted or unsubstituted $C_6$ to $C_{40}$ aromatic hydrocarbon group.

The third photocurable monomer may include a polyalkylene glycol di(meth)acrylate.

The third photocurable monomer may include a mixture of a monofunctional monomer and a polyfunctional monomer.

The photocurable composition may include about 1 wt % to about 50 wt % of the first photocurable monomer, about 1 wt % to about 50 wt % of the second photocurable monomer, and about 1 wt % to about 90 wt % of the third photocurable monomer.

In the photocurable composition a weight ratio of the second photocurable monomer to the first photocurable monomer may be about 0.6 to about 4, a weight ratio of the third photocurable monomer to the first photocurable monomer may be about 1 to about 25, and a weight ratio of the third photocurable monomer to the second photocurable monomer may be about 2.5 to about 8.

The photocurable composition may further include an initiator.

The photocurable composition may include about 1 wt % to about 50 wt % of the first photocurable monomer, about 1 wt % to about 50 wt % of the second photocurable monomer, about 1 wt % to about 97 wt % of the third photocurable monomer, and about 1 wt % to about 10 wt % of the initiator.

The first photocurable monomer may be represented by Formula 1:

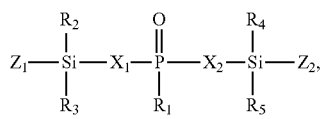
(1)

wherein, in Formula 1, $X_1$ and $X_2$ are each independently oxygen, sulfur, or —NR—, in which R is hydrogen or a $C_1$ to $C_{10}$ alkyl group; $R_1, R_2, R_3, R_4$ and $R_5$ are each independently a substituted or unsubstituted $C_1$ to $C_{10}$ alkyl group, a substituted or unsubstituted $C_6$ to $C_{20}$ aryl group, a substituted or unsubstituted $C_3$ to $C_{10}$ cycloalkyl group, or a substituted or unsubstituted $C_7$ to $C_{21}$ arylalkyl group; $Z_1$ and $Z_2$ are each independently hydrogen, a substituted or unsubstituted $C_1$ to $C_{10}$ alkyl group, a substituted or unsubstituted $C_6$ to $C_{20}$ aryl group, a substituted or unsubstituted $C_3$ to $C_{10}$ cycloalkyl group, a substituted or unsubstituted $C_7$ to $C_{21}$ arylalkyl group, or a group represented by Formula 2:

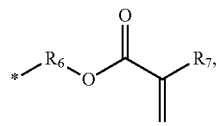
(2)

wherein, in Formula 2, "*" represents a binding site to a silicon atom of Formula 1, $R_6$ is a substituted or unsubstituted $C_1$ to $C_{10}$ alkylene group, a substituted or unsubstituted $C_6$ to $C_{20}$ arylene group, a substituted or unsubstituted $C_3$ to $C_{10}$ cycloalkylene group or a substituted or unsubstituted $C_7$ to $C_{21}$ arylalkylene group, and $R_7$ is hydrogen or a methyl group; and at least one of $Z_1$ and $Z_2$ is the group represented by Formula 2; the second photocurable monomer is represented by Formula 5:

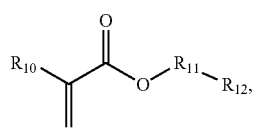
(5)

wherein, in Formula 5, $R_{10}$ is hydrogen or a methyl group; $R_{11}$ is a substituted or unsubstituted $C_1$ to $C_{10}$ aliphatic hydrocarbon group; and $R_{12}$ is a substituted or unsubstituted $C_6$ to $C_{40}$ aromatic hydrocarbon group; and the third photocurable monomer includes a polyalkylene glycol di(meth)acrylate.

The first photocurable monomer may be represented by the following Formula 10:

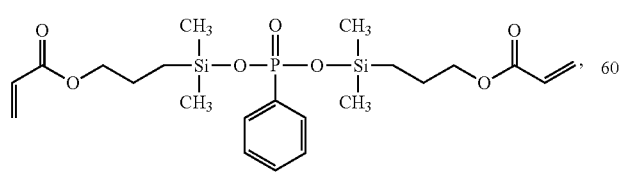
(10)

the second photocurable monomer may be represented by the following Formula 11:

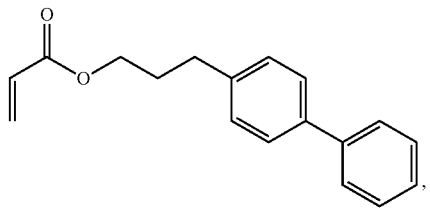
(11)

and
the third photocurable monomer may be represented by the following Formula 12:

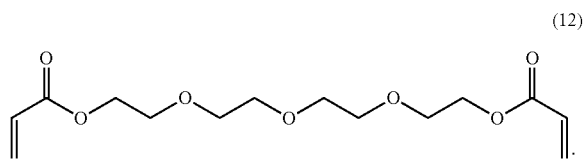 [SMILES: C=CC(=O)OCCOCCOCCOCCOC(=O)C=C]
(12)

The embodiments may be realized by providing a composition for encapsulation of an organic light emitting diode comprising the photocurable composition according to an embodiment.

The embodiments may be realized by providing an encapsulated apparatus including a member for the apparatus; and a barrier stack on the member for the apparatus, the barrier stack including an inorganic barrier layer, and an organic barrier layer, the organic barrier layer being prepared from the photocurable composition according to an embodiment.

The inorganic barrier layer may be formed of any one of a metal; a nonmetal; an oxide of a metal, a nonmetal, or mixtures thereof; a fluoride of a metal, a nonmetal, or mixtures thereof; a nitride of a metal, a nonmetal, or mixtures thereof; a carbide of a metal, a nonmetal, or mixtures thereof; an oxynitride of a metal, a nonmetal, or mixtures thereof; a boride of a metal, a nonmetal, or mixtures thereof; a silicide of a metal, a nonmetal, or mixtures thereof; an alloy of at least two metals; or an alloy of a metal and a nonmetal, and the metal may include a post transition metal, a metalloid, a transition metal, or a lanthanide metal.

The member for the apparatus may include an organic light emitting diode, an illumination device, a metal sensor pad, a microdisc laser, an electrochromic device, a photochromic device, a microelectromechanical system, a solar cell, an integrated circuit, a charge coupled device, or a light emitting diode. The organic light emitting diode may include a flexible organic light emitting diode.

The organic barrier layer may have a water vapor transmission rate of about 4.0 g/m²·24 hr or less, as measured on a 5 μm thick coating layer at 37.8° C. and 100% RH for 24 hours.

The organic barrier layer may have an outgassing amount of about 2,000 ppm or less.

The organic barrier layer may have a thickness of about 0.1 μm to about 20 μm.

BRIEF DESCRIPTION OF THE DRAWINGS

Features will be apparent to those of skill in the art by describing in detail exemplary embodiments with reference to the attached drawings in which.

DETAILED DESCRIPTION

Figure 1:
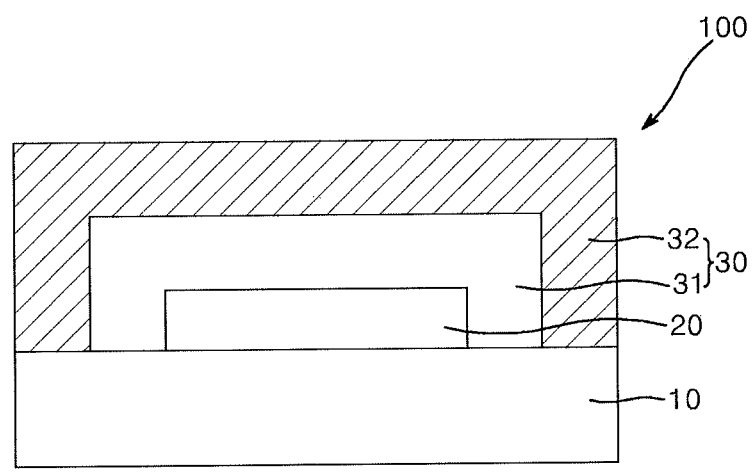
FIG. 1 illustrates a sectional view of an encapsulated apparatus according to an embodiment.

Example embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey exemplary implementations to those skilled in the art.

In the drawing figures, the dimensions of layers and regions may be exaggerated for clarity of illustration. Like reference numerals refer to like elements throughout.

As used herein, unless otherwise stated, the term "substituted" may mean that at least one hydrogen atom among functional groups is substituted with a halogen (F, Cl, Br or I), a hydroxyl group, a nitro group, a cyano group, an imino group (=NH, =NR, wherein R is a $C_1$ to $C_{10}$ alkyl group), an amino group (—$NH_2$, —NH(R'), —N(R")(R'"), wherein R', R" and R'" are each independently a $C_1$ to $C_{10}$ alkyl group), an amidino group, a hydrazine or hydrazone group, a carboxyl group, a substituted or unsubstituted $C_1$ to $C_{20}$ alkyl group, a substituted or unsubstituted $C_6$ to $C_{30}$ aryl group, a substituted or unsubstituted $C_3$ to $C_{30}$ cycloalkyl group, a substituted or unsubstituted $C_3$ to $C_{30}$ heteroaryl group, or a substituted or unsubstituted $C_2$ to $C_{30}$ heterocycloalkyl group.

As used herein, the term "hetero" may mean that a carbon atom is substituted with an atom selected from the group of N, O, S and P. The symbol "*" as used herein may mean a binding site of an element. The term "(meth)acrylate" may refer to acrylates and/or methacrylates.

In accordance with an embodiment, when A represents a glass-metal alloy die shear strength (unit: kgf) between a glass substrate and a Ni/Fe alloy after curing (e.g., adhesive strength), and B represents a curing shrinkage (unit: %) as determined by Equation 1, a photocurable composition may have a value A/B of about 0.7 kgf/% or more. In an implementation, the composition may have a value for A, e.g., a die shear strength or adhesive strength, of about 2.5 kgf or more.

Curing shrinkage=|(Specific gravity of solid photocurable composition after curing)−(Specific gravity of liquid photocurable composition before curing)|/(Specific gravity of liquid photocurable composition before curing)×100    Equation 1

In order to encapsulate a member for an apparatus, for example, the photocurable composition may be deposited between the member and an inorganic barrier layer, and may then be cured. For example, when the photocurable composition has a specific range of a ratio of adhesive strength (e.g., the die shear strength or strength between a glass substrate and a Ni/Fe alloy) to curing shrinkage and a specific range of adhesive strength or die shear strength between the glass and the Ni/Fe alloy, the encapsulated apparatus may exhibit improved reliability. As used herein, "reliability" may be determined by evaluating whether the apparatus encapsulated with the photocurable composition is operated well or not operated, under the condition of 85° C. and 85% RH for 500 hours.

If the value for A/B is less than about 0.7 kgf/%, the apparatus encapsulated with the photocurable composition is not operated well when the encapsulated apparatus left alone at 85° C. and 85% RH for 500 hours (i.e. reliability evaluating). And the encapsulated apparatus may suffer from deterioration in lifespan and reliability due to severe damage to the member for the apparatus. If A is less than about 2.5 kgf, the apparatus encapsulated with the photocurable composition is not operated well, suffering from deterioration in reliability, and may suffer from deterioration in lifespan due to severe damage to the member for the apparatus when the encapsulated apparatus left alone at 85° C. and 85% RH for 500 hours (i.e. reliability evaluating). For example, the photocurable composition according to one embodiment of the present invention may have A/B from about 1.0 kgf/% to about 1.5 kgf/%, and A from about 2.5 kgf to about 11 kgf. Thus, even when left alone at 85° C. and 85% RH for 500 hours, the apparatus encapsulated with the photocurable composition may be operated well and thus exhibits high reliability.

Specific gravity of the liquid photocurable composition before curing and specific gravity of the solid photocurable composition obtained after curing (under curing conditions of irradiation at a radiant exposure of 1,000 mJ/$cm^2$ for 10 seconds using a light source at a wavelength of 375 nm) may be measured using an electronic gravimeter (DME-220E, Shinko Co., Ltd., Japan), to calculate the curing shrinkage according to Equation 1. To measure the specific gravity of the solid photocurable composition, the photocurable composition may be coated to a thickness of 10 μm±2 μm, followed by curing, thereby preparing a film having a thickness of 8 μm to 12 μm, a width of 1.5 cm to 2.5 cm, and a length from 1.5 cm to 2.5 cm. Next, specific gravity may be measured on the prepared film.

Figure 3:
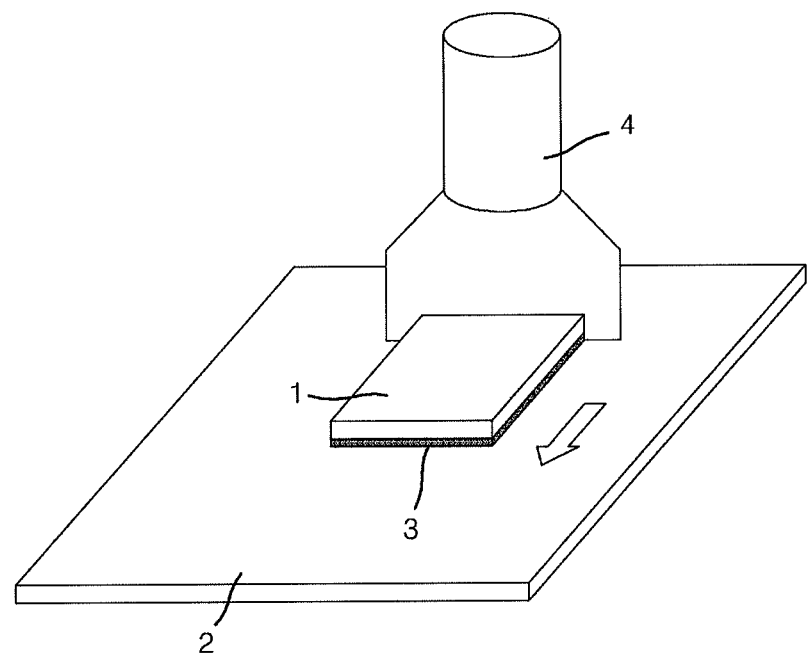
FIG. 3 illustrates a schematic diagram of a method for measuring adhesive strength.

As one example of adhesive strength (e.g., die shear strength) under severe conditions in which low adhesive strength may be measured, adhesive strength of a cured product of the photocurable composition (e.g., an organic barrier layer) between the Ni/Fe alloy substrate and the glass substrate may be measured. The adhesive strength may refer to a strength at which a glass substrate and an about 42% by weight (wt %) nickel-containing Ni/Fe alloy substrate (about 42 wt % of Ni+about 58 wt % of Fe) are bonded to each other. FIG. 3 illustrates a final specimen for measurement of adhesive or die shear strength, and a schematic diagram of measurement of adhesive strength using the final specimen. Referring to FIG. 3, to prepare the specimen for measurement of adhesive strength (e.g., shear die strength), 0.01 g of the photocurable composition may be coated to a thickness of 10 μm onto a lower side of a glass substrate 1 having a size of 5 mm×5 mm×2 mm (width×length×height). A 42 wt % Ni-containing Ni/Fe alloy substrate 2 having a size of 20 mm×80 mm×2 mm (width×length×height) may be stacked on a lower side of the photocurable composition coating layer, followed by exposure to light at a radiant exposure of 1,000 mJ/$cm^2$ for 10 seconds using a light source at a wavelength of 375 nm. As such, a specimen including a cured product 3 of the photocurable composition between the glass substrate 1 and the 42 wt % Ni-containing Ni/Fe alloy substrate 2 may be prepared. The adhesive strength (e.g., shear die strength) may be measured on the specimen using a Dage 4000 bond tester (Nordson Co., Ltd.). Referring to FIG. 3, a die contact tool 4 of the Dage 4000 bond tester, load against and contact with the edge of the glass substrate 1 and the cured product 3 of the specimen. A contact angle between the die contact tool 4 and the edge of the specimen is almost perpendicular to the plane of the specimen. The adhesive strength (e.g., shear die strength) based on a measure of force applied to the specimen by the die contact tool 4. A direction of the applied force is parallel with the plane of specimen.

To secure the above-described ranges of values for A/B and A, the photocurable composition may include, e.g., (A1) a first photocurable monomer containing phosphorus (P) and silicon (Si) (hereinafter, referred to as (A1) a first photocurable monomer); (A2) a second photocurable monomer, which is free of phosphorus and silicon and contains an aromatic group (hereinafter, referred to as (A2) a second photocurable monomer); and (A3) a third photocurable monomer free of phosphorus, silicon, and an aromatic group (hereinafter, referred to as (A3) a third photocurable monomer).

(A1) First Photocurable Monomer

The (A1) first photocurable monomer may be included in the photocurable composition. For example, the photocurable composition may exhibit improved adhesive strength to the inorganic barrier layer and may exhibit reduced curing shrinkage after curing. In an implementation, the encapsulated apparatus may exhibit improved reliability. In an implementation, the (A1) first photocurable monomer may include a vinyl group or a (meth)acrylate group as a photocurable functional group. In an implementation, the (A1) first photocurable monomer may be represented by Formula 1, below.

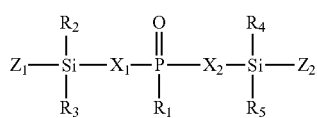

(1)

In Formula 1, $X_1$ and $X_2$ may be each independently oxygen, sulfur, or —NR— (where R is hydrogen or a $C_1$ to $C_{10}$ alkyl group).

$R_1$, $R_2$, $R_3$, $R_4$, and $R_5$ may be each independently a substituted or unsubstituted $C_1$ to $C_{10}$ alkyl group, a substituted or unsubstituted $C_6$ to $C_{20}$ aryl group, a substituted or unsubstituted $C_3$ to $C_{10}$ cycloalkyl group, or a substituted or unsubstituted $C_7$ to $C_{21}$ arylalkyl group.

$Z_1$ and $Z_2$ may be each independently hydrogen, a substituted or unsubstituted $C_1$ to $C_{10}$ alkyl group, a substituted or unsubstituted $C_6$ to $C_{20}$ aryl group, a substituted or unsubstituted $C_3$ to $C_{10}$ cycloalkyl group, a substituted or unsubstituted $C_7$ to $C_{21}$ arylalkyl group, or a group represented by Formula 2, below.

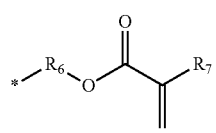

(2)

In Formula 2, "*" represents a binding site to a silicon atom of Formula 1, $R_6$ may be a substituted or unsubstituted $C_1$ to $C_{10}$ alkylene group, a substituted or unsubstituted $C_6$ to $C_{20}$ arylene group, a substituted or unsubstituted $C_3$ to $C_{10}$ cycloalkylene group, or a substituted or unsubstituted $C_7$ to $C_{21}$ arylalkylene group, and $R_7$ may be hydrogen or a methyl group.

In an implementation, at least one of $Z_1$ and $Z_2$ may be the group represented by Formula 2.

For example, $X_1$ and $X_2$ may each be oxygen; $R_1$ may be a $C_6$ to $C_{10}$ aryl group or a $C_7$ to $C_{15}$ arylalkyl group; $R_2$, $R_3$, $R_4$, and $R_5$ may be each independently a $C_1$ to $C_5$ alkyl group; and $R_6$ may be a $C_1$ to $C_{10}$ alkylene group.

The monomer represented by Formula 1 may be prepared by a suitable method. For example, the monomer represented by Formula 1 may be prepared by reacting a (meth)acryloyl halide with a compound represented by Formula 3, below.

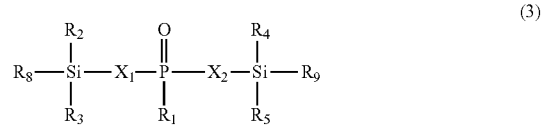

(3)

In Formula 3, $X_1$, $X_2$, $R_1$, $R_2$, $R_3$, $R_4$, and $R_5$ may be defined as in Formula 1; $R_8$ and $R_9$ may be each independently hydrogen, a substituted or unsubstituted $C_1$ to $C_{10}$ alkyl group, a substituted or unsubstituted $C_6$ to $C_{20}$ aryl group, a substituted or unsubstituted $C_3$ to $C_{10}$ cycloalkyl group, a substituted or unsubstituted $C_7$ to $C_{21}$ arylalkyl group, or —$R_6$—OH; $R_6$ may be defined as in Formula 2; and at least one of $R_8$ and $R_9$ may be —$R_6$—OH.

Reaction of the compound represented by Formula 3 with the (meth)acryloyl halide may be performed at about 0° C. to about 20° C. in the presence of an organic solvent (e.g., methylene chloride) and a basic compound (e.g., triethylamine). The compound represented by Formula 3 may be prepared by a suitable method. For example, the compound in which both $R_8$ and $R_9$ are —$R_6$—OH in Formula 3 may be prepared by reacting an unsaturated alcohol having a terminal double bond (e.g., allyl alcohol) with a compound represented by Formula 4, below.

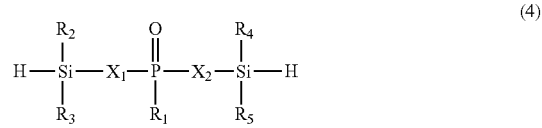

(4)

In Formula 4, $X_1$, $X_2$, $R_1$, $R_2$, $R_3$, $R_4$, and $R_5$ may be defined as in Formula 1.

The (A1) first photocurable monomer may be present in the photocurable composition in an amount of about 1 wt % to about 50 wt %, e.g., about 4 wt % to about 30 wt %. Within this range, the above ranges of values for A/B and A may be achieved, and the encapsulated apparatus may not suffer from deterioration in reliability upon encapsulation.

The (A1) first photocurable monomer may be present in an amount of about 1 wt % to about 50 wt %, e.g., about 5 wt % to about 30 wt %, based on a total weight of the (A1)+(A2)+(A3) first to third photocurable monomers. Within this range, the above ranges of A/B and A may be achieved and the encapsulated apparatus may not suffer from deterioration in reliability upon encapsulation.

(A2) Second Photocurable Monomer

The (A2) second photocurable monomer may be a non-phosphorus containing and non-silicon containing monomer, e.g., may be free of phosphorus and silicon, and may include an aromatic group. In an implementation, the (A2) second photocurable monomer may include a vinyl group or a (meth)acrylate group as a photocurable functional group. In an implementation, the (A2) second photocurable monomer may be represented by Formula 5, below.

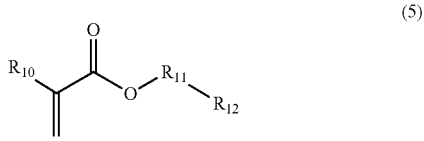

(5)

In Formula 5, $R_{10}$ may be hydrogen or a methyl group; $R_{11}$ may be a substituted or unsubstituted $C_1$ to $C_{10}$ aliphatic hydrocarbon group; and $R_{12}$ may be a substituted or unsubstituted $C_6$ to $C_{40}$ aromatic hydrocarbon group.

For example, $R_{11}$ may be a $C_1$ to $C_{10}$ alkylene group or a $C_3$ to $C_{10}$ cycloalkylene group; and $R_{12}$ may be a $C_6$ to $C_{20}$ aryl group, a $C_1$ to $C_{10}$ alkyl group-substituted $C_6$ to $C_{20}$ aryl group, or a $C_6$ to $C_{20}$ aryl group-substituted $C_6$ to $C_{20}$ aryl group.

The (A2) second photocurable monomer may be prepared by a suitable method, or may be commercially available.

The (A2) second photocurable monomer may be present in the photocurable composition in an amount of about 1 wt % to about 50 wt %, e.g., about 5 wt % to about 20 wt %. Within this range, the above ranges of values for A/B and A may be achieved, and the encapsulated apparatus may not suffer from deterioration in reliability upon encapsulation.

In an implementation, the (A2) second photocurable monomer may be present in an amount of about 1 wt % to about 50 wt %, e.g., about 10 wt % to about 20 wt %, based on the total weight of the (A1)+(A2)+(A3) first to third photocurable monomers. Within this range, the above ranges of A/B and A may be achieved, and the encapsulated apparatus may not suffer from a deterioration in reliability upon encapsulation.

(A3) Third Photocurable Monomer

The (A3) third photocurable monomer may be a non-phosphorus containing, non-silicon containing, and non-aromatic containing monomer, e.g., may be free of phosphorus, silicon, and an aromatic group. In an implementation, the (A3) third photocurable monomer may include a vinyl group or a (meth)acrylate group as a photocurable functional group.

In an implementation, the (A3) third photocurable monomer may include a mixture of a monofunctional monomer and a polyfunctional monomer. In such a mixture, the monofunctional monomer and the polyfunctional monomer may be present in a weight ratio of about 1:0.1 to about 1:4, e.g., about 1:1 to about 1:4 or about 1:2 to about 1:4.

The (A3) third photocurable monomer may include, e.g., unsaturated carboxylic acid esters containing a $C_1$ to $C_{20}$ alkyl group, a $C_3$ to $C_{20}$ cycloalkyl group, or a hydroxyl group; $C_1$ to $C_{20}$ aminoalkyl group-containing unsaturated carboxylic acid esters; vinyl esters of $C_1$ to $C_{20}$ saturated or unsaturated carboxylic acids; vinyl cyanide compounds; unsaturated amide compounds; monofunctional or polyfunctional (meth) acrylates of monohydric or polyhydric alcohols, or the like. The term "polyhydric alcohol" may refer to alcohols containing two or more hydroxyl groups, e.g., polyhydric alcohol containing 2 to 20 hydroxyl groups, 2 to 10 hydroxyl groups, or 2 to 6 hydroxyl groups.

In an implementation, the (A3) third photocurable monomer may include, e.g., unsaturated carboxylic acid esters including (meth)acrylic acid esters, such as methyl (meth) acrylate, ethyl (meth)acrylate, butyl (meth)acrylate, 2-hydroxyethyl (meth)acrylate, 2-hydroxybutyl (meth)acrylate, hexyl (meth)acrylate, octyl (meth)acrylate, nonyl (meth) acrylate, decanyl (meth)acrylate, undecanyl (meth)acrylate, dodecyl (meth)acrylate, cyclohexyl (meth)acrylate, or the like; unsaturated carboxylic acid aminoalkyl esters, such as 2-aminoethyl (meth)acrylate, 2-dimethylaminoethyl (meth) acrylate, and the like; saturated or unsaturated carboxylic acid vinyl esters, such as vinyl acetate, and the like; vinyl cyanide compounds, such as (meth)acrylonitrile, and the like; unsaturated amide compounds, such as (meth)acrylamide, and the like; and monofunctional or polyfunctional (meth)acrylates of monohydric or polyhydric alcohols, such as ethylene glycol di(meth)acrylate, triethylene glycol di(meth)acrylate, trimethylolpropane tri(meth)acrylate, 1,4-butanediol di(meth) acrylate, 1,6-hexanediol di(meth)acrylate, octanediol di(meth)acrylate, nonanediol di(meth)acrylate, decanediol di(meth)acrylate, undecanediol di(meth)acrylate, dodecanediol di(meth)acrylate, neopentyl glycol di(meth)acrylate, pentaerythritol di(meth)acrylate, pentaerythritol tri (meth)acrylate, pentaerythritol tetra(meth)acrylate, dipentaerythritol di(meth)acrylate, dipentaerythritol tri (meth)acrylate, dipentaerythritol tetra(meth)acrylate, dipentaerythritol penta(meth)acrylate, dipentaerythritol hexa(meth)acrylate, diethylene glycol di(meth)acrylate, tri (propylene glycol) di(meth)acrylate, poly(propylene glycol) di(meth)acrylate, or the like. For example, the (A3) third photocurable monomer may include at least one of $C_1$ to $C_{20}$ alkyl-group containing (meth)acrylates, $C_2$ to $C_{20}$ diol di(meth)acrylates, $C_3$ to $C_{20}$ triol tri(meth)acrylates, and $C_4$ to $C_{20}$ tetraol tetra(meth)acrylates. For example, the (A3) third photocurable monomer may be a polyalkylene glycol di(meth)acrylate and may include a $C_2$ to $C_5$ linear or branched alkylene glycol unit-containing di(meth)acrylate.

The (A3) third photocurable monomer may be present in the photocurable composition in an amount of about 1 wt % to about 97 wt %, e.g., about 1 wt % to about 90 wt % or about 45 wt % to about 80 wt %. Within this range, the above ranges of values for A/B and A may be achieved, and the encapsulated apparatus may not suffer from deterioration in reliability upon encapsulation.

The (A3) third photocurable monomer may be present in an amount of about 1 wt % to about 98 wt %, e.g., about 1 wt % to about 90 wt % or about 50 wt % to about 80 wt %, based on total weight of the (A1)+(A2)+(A3) first to third photocurable monomers. Within this range, the above ranges of A/B and A may be achieved, and the encapsulated apparatus may not suffer from deterioration in reliability upon encapsulation.

In the photocurable composition, a weight ratio of the (A2) second photocurable monomer to the (A1) first photocurable monomer may be about 0.6 to about 4, a weight ratio of the (A3) third photocurable monomer to the (A1) first photocurable monomer may be about 1 to about 25, and/or a weight ratio of the (A3) third photocurable monomer to the (A2) second photocurable monomer may be about 2.5 to about 8. Within this range, the encapsulated apparatus may exhibit high reliability.

In an implementation, the photocurable composition may further include an initiator. For example, the initiator may include a photopolymerization initiator. The photopolymerization initiator may include a suitable photopolymerization initiator for performing photocuring reactions. For example, the photopolymerization initiator may include a triazine initiator, an acetophenone initiator, a benzophenone initiator, a thioxanthone initiator, a benzoin initiator, a phosphorus-containing initiator, an oxime initiator, or mixtures thereof.

Examples of the triazine initiator may include 2,4,6-trichloro-s-triazine, 2-phenyl-4,6-bis(trichloromethyl)-s-triazine, 2-(3',4'-dimethoxystyryl)-4,6-bis(trichloromethyl)-s-triazine, 2-(4'-methoxynaphthyl)-4,6-bis(trichloromethyl)-s-triazine, 2-(p-methoxyphenyl)-4,6-bis(trichloromethyl)-s-triazine, 2-(p-tolyl)-4,6-bis(trichloromethyl)-s-triazine, 2-biphenyl-4,6-bis(trichloromethyl)-s-triazine, 2,4-bis (trichloromethyl)-6-styryl-s-triazine, 2-(naphtho-1-yl)-4,6-bis(trichloromethyl)-s-triazine, 2-(4-methoxynaphtho-1-yl)-4,6-bis(trichloromethyl)-s-triazine, 2,4-trichloromethyl (piperonyl)-6-triazine, 2,4-(trichloromethyl(4'-methoxy styryl)-6-triazine, or mixtures thereof. Examples of the acetophenone initiator may include 2,2'-diethoxyacetophenone, 2,2'-dibuthoxyacetophenone, 2-hydroxy-2-methyl propiophenone, p-t-butyl trichloroacetophenone, p-t-butyl dichloroacetophenone, 4-chloroacetophenone, 2,2'-dichloro-4-phenoxyacetophenone, 2-methyl-1-(4-(methylthio)phenyl)-2-morpholinopropan-1-one, 2-benzyl-2-dimethylamino-1-(4-morpholinophenyl)-butan-1-one, or mixtures thereof. Examples of the benzophenone initiator may include benzophenone, benzoyl benzoate, methyl benzoylbenzoate, 4-phenyl benzophenone, hydroxybenzophenone, acrylated benzophenone, 4,4'-bis(dimethylamino)benzophenone, 4,4'-dichlorobenzophenone, 3,3'-dimethyl-2-methoxybenzophenone, or mixtures thereof. Examples of the thioxanthone initiator may include thioxanthone, 2-methyl thioxanthone, isopropyl thioxanthone, 2,4-diethyl thioxanthone, 2,4-diisopropyl thioxanthone, 2-chlorothioxanthone, or mixtures thereof. Examples of the benzoin initiator may include benzoin, benzoin methyl ether, benzoin ethyl ether, benzoin isopropyl ether, benzoin isobutyl ether, benzyl dimethyl ketal, or mixtures thereof. Examples of the phosphorus-containing initiator may include diphenyl(2,4,6-trimethylbenzoyl)phosphine oxide, or mixtures thereof. Examples of the oxime initiator may include 2-(o-benzoyloxime)-1-[4-(phenylthio) phenyl]-1,2-octanedione, 1-(o-acetyloxime)-1-[9-ethyl-6-(2-methylbenzoyl)-9H-carbazole-3-yl]ethanone, or mixtures thereof.

The initiator may be present in the photocurable composition in an amount of about 0.1 wt % to about 10 wt %, e.g., 1 wt % to 10 wt %, 1 wt % to 8 wt % or about 1 wt % to about 5 wt %. Within this range, the photocurable composition may undergo sufficient photopolymerization under exposure to light, and deterioration in transmittance (due to unreacted initiator remaining after photopolymerization) may be reduced and/or prevented.

The initiator may be present in an amount of about 1 part by weight to about 10 parts by weight, e.g., about 1 part by weight to about 5 parts by weight, based on 100 parts by weight of the (A1)+(A2)+(A3) first to third photocurable monomers. Within this range, the photocurable composition may undergo sufficient photopolymerization under exposure to light, and deterioration in transmittance (due to the unreacted initiator remaining after photopolymerization) may be reduced and/or prevented.

The photocurable composition may be formed by, e.g., mixing the photocurable monomers and the initiator. In an implementation, the photocurable composition may be formed as a solvent-free photocurable composition.

The photocurable composition may have a degree of curing of about 90% or more, e.g., about 90% to about 99% or about 93% to about 98.5%. Within this range, the photocurable composition may realize for form a layer that does not suffer from a shift due to low curing shrinkage stress after curing, thereby allowing the photocurable composition to be used for encapsulation of devices.

The photocurable composition may have a curing shrinkage of about 1% to about 10%, e.g., about 7% to about 9%, as determined by Equation 1. Within this range, the photocurable composition may realize or form a layer that does not suffer from a shift due to low curing shrinkage stress after curing, thereby allowing the photocurable composition to be used for encapsulation of devices.

The member for the apparatus, e.g., the member for displays, may suffer from degradation or deterioration in quality if gas or liquid from a surrounding environment were to permeate thereto, e.g., if atmospheric oxygen and/or moisture and/or water vapor were to permeate thereto, and/or if chemicals used in the preparation of electronic products were to permeate thereto. In an effort to help reduce and/or prevent such degradation or deterioration, the member for the apparatus may be sealed or encapsulated.

The member for the apparatus may include, e.g., an organic light emitting diode (OLEDs), an illumination device, a metal sensor pad, a microdisc laser, an electrochromic device, a photochromic device, a microelectromechanical system, a solar cell, an integrated circuit, a charge coupled device, a light emitting diode, or the like. The organic light emitting diodes may include a flexible organic light emitting diode or the like.

The photocurable composition may form an organic barrier layer used for sealing or encapsulation of the member for the apparatus, e.g., organic light emitting diodes or flexible organic light emitting diodes. For example, a composition for encapsulation of an organic light emitting diode may include the photocurable composition according to an embodiment.

In an implementation, the organic barrier layer may be formed of or prepared from the photocurable composition. In an implementation, the organic barrier layer may be formed by photocuring the photocurable composition. The organic barrier layer may be prepared by coating the photocurable composition to a thickness of about 0.1 μm to about 20 μm, e.g., about 1 μm to about 10 μm, followed by curing the photocurable composition through irradiation at, e.g., about 10 mW/cm$^2$ to about 500 mW/cm$^2$ for about 1 second to about 50 seconds.

The organic barrier layer may exhibit low water vapor transmission rate and outgassing, and may have high adhesive strength to an inorganic barrier layer. The organic barrier layer and the inorganic barrier layer described below may form a barrier stack, and thus may be used for encapsulation of the member for the apparatus. In an implementation, the organic barrier layer may have a water vapor transmission rate of about 4.0 g/m$^2$·24 hr or less, as measured on a 5 μm thick coating layer at 37.8° C. and 100% RH for 24 hours. Within this range, the organic barrier layer may be suitably used for encapsulation of the member for the apparatus. In an implementation, the organic barrier layer may have a water vapor transmission rate of about 1.0 g/m$^2$·24 hr to about 4.0 g/m$^2$·24 hr, e.g., about 2.5 g/m$^2$·24 hr to about 3.2 g/m$^2$·24 hr.

In an implementation, the organic barrier layer may have an outgassing amount of about 2,000 ppm or less. Within this range, the organic barrier layer may have an insignificant side effect of outgassing on the member for the apparatus, and the member for the apparatus may have long lifespan. In an implementation, the organic barrier layer may have an outgassing amount of about 1,000 ppm or less, e.g., about 10 ppm to about 1,000 ppm. In an implementation, the organic barrier layer may have an adhesive strength to the inorganic barrier layer of about 2.5 kgf or more, e.g., about 2.5 kgf to about 11 kgf. Within this range, the encapsulated apparatus may exhibit improved reliability.

According to an embodiment, the barrier stack may include the organic and inorganic barrier layers. The inorganic barrier layer may include different components from those of the organic barrier layer, thereby supplementing the effects of the organic barrier layer.

The inorganic barrier layer may be a suitable inorganic barrier that exhibits excellent light transmittance and excellent moisture and/or oxygen barrier properties. For example, the inorganic barrier layer may include at least one selected from a metal; a nonmetal; an oxide of a metal, a nonmetal, or mixtures thereof; a fluoride of a metal, a nonmetal, or mixtures thereof; a nitride of a metal, a nonmetal, or mixtures thereof; a carbide of a metal, a nonmetal, or mixtures thereof; an oxynitride of a metal, a nonmetal, or mixtures thereof; a boride of a metal, a nonmetal, or mixtures thereof; a silicide of a metal, a nonmetal, or mixtures thereof; an alloy of at least two metals; or an alloy of a metal and a nonmetal. The metal may include, e.g., a post transition metal, metalloid, transition metal, lanthanide metal, or the like. For example, the metal may include silicon, aluminum, iron, nickel, or the like, and the inorganic barrier layer may include silicon oxide, silicon nitride, silicon oxynitride, ZnSe, ZnO, $Sb_2O_3$, $Al_2O_3$, $In_2O_3$, or $SnO_2$.

The organic barrier layer may help secure the aforementioned water vapor transmission rate, outgassing amount, and adhesive strength. As a result, when the organic and inorganic barrier layers are alternately deposited, the inorganic barrier layer may help secure smoothness. In addition, the organic barrier layer may help reduce the likelihood of and/or prevent defects of the inorganic barrier layer from spreading to other inorganic barrier layers.

The barrier stack may include a suitable number of organic and inorganic barrier layers. Combination of the organic and inorganic barrier layers may vary with a level of permeation resistance to oxygen and/or moisture and/or water vapor and/or chemicals.

In an implementation, the organic and inorganic barrier layers may be alternately deposited. For example, the aforementioned composition may have an effect on the organic barrier layer due to the properties thereof. As a result, the organic and inorganic barrier layers may supplement or reinforce encapsulation of the member for the apparatus. For example, the organic and inorganic layers may be alternately formed in two or more layers, respectively. In an implementation, the organic and inorganic layers may be formed in a total of 10 layers or less (e.g., 2 layers to 10 layers), or in a total of 7 layers or less (e.g., 2 layers to 7 layers).

In the barrier stack, one organic barrier layer may have a thickness of about 0.1 µm to about 20 µm, e.g., about 1 µm to about 10 µm, and one inorganic barrier layer may have a thickness of about 5 nm to about 500 nm, e.g., about 5 nm to about 50 nm. The barrier stack may be a thin film encapsulant and may have an encapsulation thickness of about 5 µm or less, e.g., about 1.5 µm to about 5 µm. Within this range, the barrier stack may be used for encapsulation of the member for the apparatus. In an implementation, the inorganic barrier layer may be formed by a vacuum process, e.g., sputtering, chemical vapor deposition, plasma chemical vapor deposition, evaporation, sublimation, electron cyclotron resonance-plasma enhanced chemical vapor deposition, or combinations thereof. The organic barrier layer may be deposited using the same method as in the inorganic barrier layer, or may be formed by coating the photocurable composition, followed by curing.

According to an embodiment, an encapsulated apparatus may include a member for the apparatus and inorganic and organic barrier layers on the member for the apparatus, and the organic barrier layer may be formed of or prepared from the above-described photocurable composition.

The organic barrier layer may be formed on an upper or lower side of the inorganic barrier layer, and the inorganic barrier layer may be formed on an upper side of the member for the apparatus, an upper side of the organic barrier layer, or a lower side of the organic barrier layer. As such, the encapsulated apparatus may allow the member for the apparatus to be encapsulated by the inorganic and organic barrier layers (which exhibit different properties from each other), and the inorganic and organic barrier layers may supplement or reinforce encapsulation of the member for the apparatus.

Each of the inorganic and organic barrier layers may be included in multiple layers, e.g., two layers or more, in the encapsulated apparatus. In an implementation, the inorganic and organic barrier layers may be deposited alternately, e.g., in order of inorganic barrier layer/organic barrier layer/inorganic barrier layer/organic barrier layer. In an implementation, the inorganic and organic barrier layers may be included in a total of 10 layers or less (e.g., 2 layers to 10 layers) or in a total of 7 layers or less (e.g., 2 layers to 7 layers).

Details of the organic and inorganic barrier layers are as described above.

At least one of the organic and inorganic barrier layers may be coupled with a substrate in order to encapsulate devices, and the member for the apparatus may include the substrate, depending upon kinds thereof. The substrate may include a suitable substrate in which the member for the apparatus is stacked on the substrate. For example, the substrate may include transparent glass substrates, plastic sheets, silicon substrates, metal substrates, or the like.

FIG. 1 illustrates a sectional view of an encapsulated apparatus according to an embodiment. Referring to FIG. 1, an encapsulated apparatus 100 may include a substrate 10, a member for the apparatus 20 on the substrate 10, and a barrier stack 30 on the member for the apparatus 20. The barrier stack 30 may include an inorganic barrier layer 31 and an organic barrier layer 32, and the inorganic barrier layer 31 may be in contact with the member for the apparatus 20.

Figure 2:
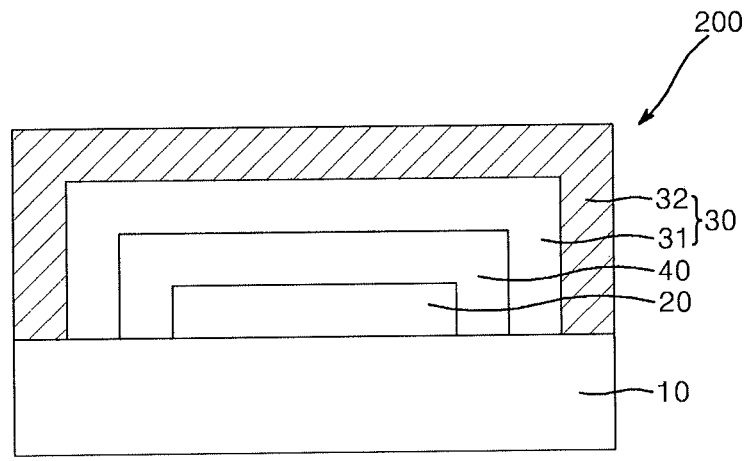
FIG. 2 illustrates a sectional view of an encapsulated apparatus according to an embodiment.

FIG. 2 illustrates a sectional view of an encapsulated apparatus according to another embodiment. Referring to FIG. 2, an encapsulated apparatus 200 may include a substrate 10, a member for the apparatus 20 on the substrate 10, and a barrier stack 30 on the member for the apparatus 20. The barrier stack 30 may include an inorganic barrier layer 31 and an organic barrier layer 32, the inorganic barrier layer 31 encapsulating an interior space 40 in which the member for the apparatus 20 is received.

Although each of the inorganic and organic barrier layers is illustrated as being formed in a single layer in FIGS. 1 and 2, each of the inorganic and organic barrier layers may be formed as multiple layers. In an implementation, the encapsulated apparatus may further include a sealant and/or a substrate on a lateral side and/or an upper side of the composite barrier layer including the inorganic and organic barrier layers (not shown in FIGS. 1 and 2).

The encapsulated apparatus may be prepared by a suitable method. The member for the apparatus may be formed on the substrate, followed by forming an inorganic barrier layer on the member for the apparatus. The photocurable composition may be coated to a desired thickness, e.g., of about 1 µm to about 5 µm, using, e.g., spin coating, slit coating, or the like, followed by irradiation to form an organic barrier layer. The procedure of forming the inorganic and organic barrier layers may be repeated (e.g., such that the inorganic and organic barrier layers are formed in a total of 10 layers or less). In an implementation, the encapsulated apparatus may include, e.g., an organic light emitting display including an organic light emitting part, a display such as a liquid crystal display, a solar cell, or the like.

The following Examples and Comparative Examples are provided in order to highlight characteristics of one or more embodiments, but it will be understood that the Examples and Comparative Examples are not to be construed as limiting the scope of the embodiments, nor are the Comparative Examples to be construed as being outside the scope of the embodiments. Further, it will be understood that the embodiments are not limited to the particular details described in the Examples and Comparative Examples.

Preparative Example 1

Preparation of Compound Represented by Formula 10

Operation 1: A compound represented by Formula 6 was prepared according to Reaction Scheme 1. Specifically, 34.42 g of 1,1,3,3-tetramethyldisiloxane (represented by Formula 8 in Reaction Scheme 1, Aldrich Co., Ltd.), 2.7 g of water, and 41.67 g of methylene chloride were placed in a 1,000 ml flask (provided with a cooling tube and a stirrer), followed by stirring at ambient (e.g., room) temperature. Next, the temperature of the flask was lowered to 0° C., followed by slowly introducing 10 g of phenylphosphonic dichloride (represented by Formula 7 in Reaction Scheme 1, Aldrich Co., Ltd.) into the flask. Next, a reaction was performed at ambient temperature, thereby preparing the compound represented by Formula 6 according to Reaction Scheme 1. The obtained compound represented by Formula 6 had a purity of 98% as determined by HLPC.

<Reaction Scheme 1>

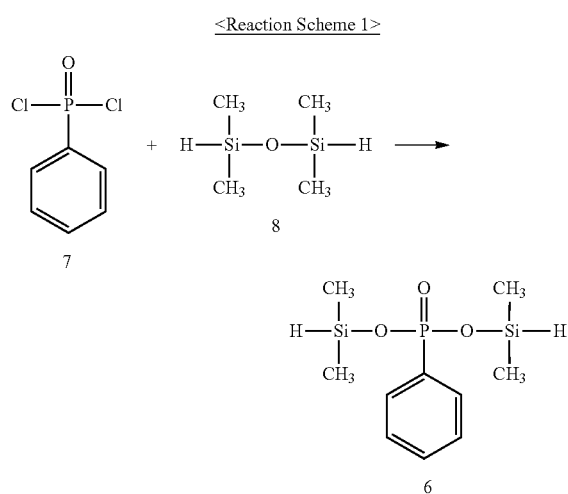

Operation 2: 100 g of ethyl acetate, 34.25 g of the compound (represented by Formula 6 in Reaction Scheme 1) obtained in Operation 1, 29 g of allyl alcohol (Aldrich Co., Ltd.), and a platinum(0)-1,3-divinyl-1,1,3,3 tetramethyldisiloxane complex (Aldrich Co., Ltd.) as a Pt catalyst were placed in a 1,000 ml flask (provided with a cooling tube and a stirrer), followed by refluxing at 80° C. for 4 hours. Next, ethyl acetate was removed, thereby obtaining a compound represented by Formula 9, below.

(Formula 9)

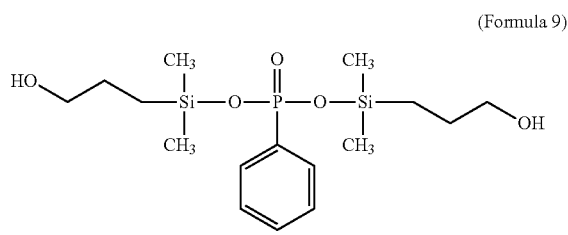 [SMILES: C[Si](C)(CCCO)OP(=O)(O[Si](C)(C)CCCO)c1ccccc1]

Figure 4:
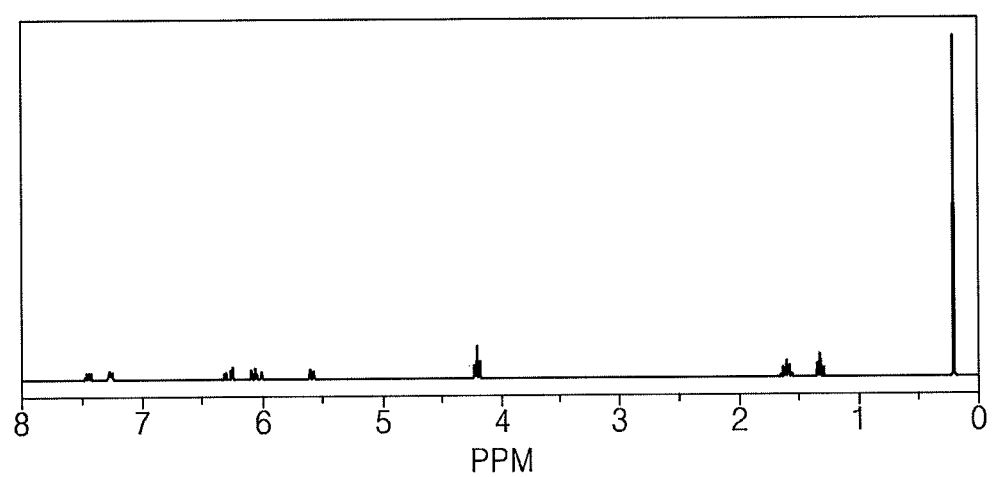
FIG. 4 illustrates an NMR result of a monomer of Preparative Example 1, as represented by Formula 10.

Operation 3: 100 g of methylene chloride, 47.25 g of the compound represented by Formula 9 obtained in Operation 2, and 21.2 g of acryloyl chloride were placed in a 1,000 ml flask (provided with a cooling tube and a stirrer), followed by stirring. Next, the temperature of the flask was lowered to 0° C., followed by slowly introducing 27.8 g of triethylamine into the flask. Next, reaction was performed at ambient temperature for 4 hours, thereby obtaining a compound represented by Formula 10. It was confirmed from the result of 1H-NMR of FIG. 4 that the obtained compound was the compound represented by Formula 10.

(Formula 10)

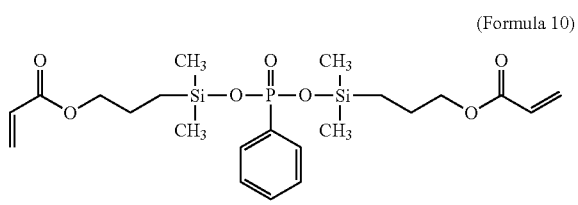 [SMILES: C=CC(=O)OCCC[Si](C)(C)OP(=O)(O[Si](C)(C)CCCOC(=O)C=C)c1ccccc1]

Preparative Example 2

Preparation of Compound Represented by Formula 11

100 g of methylene chloride, 42.4 g of [1,1'-biphenyl]-4-propanol, and 30.6 g of acryloyl chloride were placed in a 1,000 ml flask (provided with a cooling tube and a stirrer), followed by stirring. Next, the temperature of the flask was lowered to 0° C., followed by slowly introducing 40.4 g of triethylamine into the flask. Next, a reaction was performed at ambient temperature for 4 hours, thereby obtaining a compound represented by Formula 11.

(Formula 11)

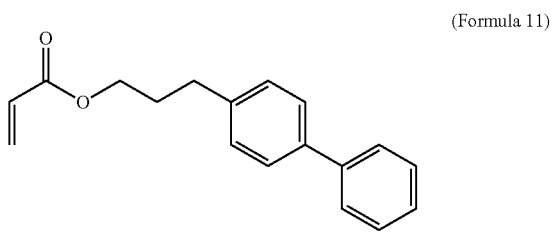 [SMILES: C=CC(=O)OCCCc1ccc(-c2ccccc2)cc1]

(1) Photocurable monomer;
(A1) First photocurable monomer: The compound represented by Formula 10.
(A2) Second photocurable monomer: The compound represented by Formula 11.
(A3) Third photocurable monomer: Tetra(ethylene glycol) diacrylate (Aldrich Co., Ltd.) represented by Formula 12.

(Formula 12)

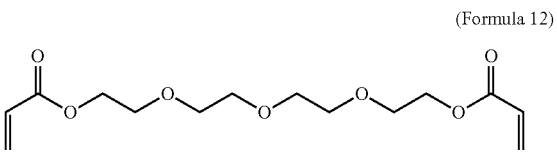 [SMILES: C=CC(=O)OCCOCCOCCOCCOC(=O)C=C]

(2) Initiator: Diphenyl(2,4,6-trimethylbenzoyl)phosphine oxide (TPO, BASF Co., Ltd.) as a photopolymerization initiator.

Examples 1 to 3 and Comparative Examples 1 to 3

In a 125 ml brown polypropylene bottle, photocurable monomers and an initiator were placed (without solvents) in amounts as listed in Table 2, followed by mixing for 3 hours using a shaker, thereby preparing compositions of Examples 1 to 3 and Comparative Examples 1 to 3.

Each of the compositions prepared in the Examples and Comparative Examples was evaluated as to the following properties. The results are shown in Table 2.

Evaluation of Properties

1. Water vapor transmission rate: a water vapor transmission rate tester (PERMATRAN-W 3/33, MOCON Co., Ltd.) was used. The photocurable composition was spray-coated onto an aluminum (Al) sample holder, followed by UV curing through UV irradiation at 100 mW/cm$^2$ for 10 seconds, thereby forming a cured specimen having a coating thickness of 5 μm. Water vapor transmission rate was measured on the 5 μm thick cured specimen at 37.8° C. and 100% RH for 24 hours using the water vapor transmission rate tester (PERMATRAN-W 3/33, MOCON Co., Ltd.).

2. Outgassing amount: The photocurable composition was spray-coated onto a glass substrate, followed by UV curing through UV irradiation at 100 mW/cm$^2$ for 10 seconds, thereby obtaining an organic barrier layer specimen having a size of 20 cm×20 cm×3 μm (width×length×thickness). Outgassing amount was measured on the specimen using a GC/MS tester (Perkin Elmer Clarus 600). GC/MS utilized a DB-5MS column (length: 30 m, diameter: 0.25 mm, thickness of stationary phase: 0.25 μm) as a column, and helium gas (flow rate: 1.0 mL/min, average velocity=32 cm/s) as a mobile phase. Further, a split ratio was 20:1, and the specimen was maintained at 40° C. for 3 minutes, followed by heating at a rate of 10° C./min and then maintaining at 320° C. for 6 minutes. Outgas was collected under the conditions that a glass size was 20 cm×20 cm, a collection container was a Tedlar bag, collection temperature was 90° C., collection time was 30 minutes, N$_2$ purging was supplied at a flow rate of 300 mL/min and Tenax GR (5% phenyl methyl polysiloxane) was used as an adsorbent. A calibration curve was plotted using a toluene solution in n-hexane in a concentration of 150 ppm, 400 ppm and 800 ppm as a standard solution, wherein R2 value for plotting calibration curve was 0.9987. The above conditions are summarized in Table 1.

TABLE 1

| Conditions | Details |
| --- | --- |
| Collection conditions | Glass size: 20 cm × 20 cm<br>Collection container: Tedlar bag<br>Collection temperature: 90° C.<br>Collection time: 30 min<br>N$_2$ purge flow rate: 300 mL/min<br>Adsorbent: Tenax GR (5% phenyl methyl polysiloxane) |
| Conditions for plotting calibration curve | Standard solution: Toluene in n-hexane<br>Concentration range (reference): 150 ppm, 400 ppm, 800 ppm<br>R2: 0.9987 |

TABLE 1-continued

| Conditions | | Details |
| --- | --- | --- |
| GC/MS conditions | Column | DB-5MS→30 m × 0.25 mm × 0.25 μm (5% phenyl methyl polysiloxane) |
| | Mobile phase | He |
| | Flow | 1.0 mL/min (Average velocity = 32 cm/s) |
| | Split | Split ratio = 20:1 |
| | Method | 40° C. (3 min) → 10° C./min → 320° C. (6 min) |

3. Adhesive strength (kgf): To measure adhesive strength, 0.01 g of the photocurable composition was coated to a thickness of 10 μm onto a lower side of a glass substrate having a size of 5 mm×5 mm×2 mm (width×length×height). A 42 wt % of Ni-containing Ni/Fe alloy substrate having a size of 20 mm×80 mm×2 mm (width×length×height) was stacked on a lower side of the photocurable composition coating layer, followed by exposure to light at a radiant exposure of 1,000 mJ/cm$^2$ for 10 seconds using a light source at a wavelength of 375 nm. In this way, a specimen having a cured product (thickness: 10 μm) of the photocurable composition between the glass substrate and the Ni/Fe alloy substrate was prepared. The adhesive strength (e.g., shear die strength) was measured on the prepared specimen using a Dage 4000 bond tester (Nordson Co., Ltd.). Referring to FIG. 3, a die contact tool 4 of the Dage 4000 bond tester, load against and contact with the edge of the glass substrate 1 and the cured product 3 of the specimen. A contact angle between the die contact tool 4 and the edge of the specimen is almost perpendicular to the plane of the specimen. The adhesive strength (e.g., shear die strength) based on a measure of force applied to the specimen by the die contact tool 4. A direction of the applied force is parallel with the plane of specimen.

4. Curing shrinkage (%): Specific gravity of a liquid photocurable composition before curing, and specific gravity of a solid photocurable composition obtained after curing under curing conditions of irradiation at a radiant exposure of 1,000 mJ/cm$^2$ for 10 seconds using a light source at a wavelength of 375 nm were measured using an electronic gravimeter (DME-220E, Shinko Co., Ltd., Japan). To measure the specific gravity of the solid photocurable composition, the photocurable composition was coated to a thickness of 10 μm±2 μm, followed by curing under the above conditions, thereby preparing a film having a thickness from 8 μm to 12 μm, a width from 1.5 cm to 2.5 cm and a length from 1.5 cm to 2.5 cm. Next, the obtained values of specific gravity were substituted into Equation 1, thereby calculating curing shrinkage.

5. Reliability: An apparatus encapsulated with the photocurable composition was left alone at 85° C. and 85% RH for 500 hours, followed by evaluating whether the encapsulated apparatus was operated well (whether an OLED apparatus was operated and whether pixels were damaged, upon power supply). An OLED apparatus exhibiting good reliability (e.g., the OLED apparatus was operated and did not suffer from damage of pixels on the screen) was rated as "O", and an OLED apparatus exhibiting poor reliability (e.g., the OLED apparatus was not operated or suffered from damage of pixels) was rated as "X".

TABLE 2

| | | Example 1 | Example 2 | Example 3 | Comparative Example 1 | Comparative Example 2 | Comparative Example 3 |
| --- | --- | --- | --- | --- | --- | --- | --- |
| Photocurable | (A1) | 30 | 10 | 5 | — | 100 | — |
| monomer | (A2) | 20 | 10 | 20 | — | — | 100 |
| (wt %) | (A3) | 50 | 80 | 75 | 100 | — | — |
| Initiator (parts by weight) | | 5 | 5 | 5 | 5 | 5 | 5 |

TABLE 2-continued

| | Example 1 | Example 2 | Example 3 | Comparative Example 1 | Comparative Example 2 | Comparative Example 3 |
|---|---|---|---|---|---|---|
| Water vapor transmission rate (g/m² · 24 hr) | 2.7 | 2.5 | 3.2 | 3.5 | 12.7 | 7.6 |
| Outgassing amount (ppm) | 290 | 310 | 350 | 320 | 340 | 1310 |
| Adhesive strength (kgf) (A) | 10.8 | 9.9 | 9.2 | 8.1 | 5.2 | 2.3 |
| Curing shrinkage (%) (B) | 7.3 | 8.1 | 7.9 | 13.6 | 7.7 | 3.1 |
| (A)/(B) (kgf/%) | 1.48 | 1.22 | 1.16 | 0.60 | 0.68 | 0.74 |
| Reliability | O | O | O | X | X | X |

Unit of amount of photocurable monomer: wt % based on (A1) + (A2) + (A3)
Unit of amount of initiator: parts by weight based on 100 parts by weight of (A1) + (A2) + (A3)

As shown in Table 2, it may be seen that the photocurable compositions according to Examples 1-3 realized an encapsulated apparatus exhibiting excellent reliability, e.g., the photocurable composition had a ratio of adhesive strength to curing shrinkage of 0.7 kgf/% or more and an adhesive strength of 2.5 kgf or more. Conversely, it may be seen that the photocurable compositions of Comparative Examples 1 and 2 (having a ratio of adhesive strength to curing shrinkage of less than 0.7 kgf/%) and the photocurable composition of Comparative Example 3 (having an adhesive strength of less than 2.5 kgf) provided poor reliability to the encapsulated apparatus.

By way of summation and review, organic light emitting diodes may suffer from deterioration in performance and lifespan thereof, caused by oxidation of organic materials and/or electrode materials due to moisture or oxygen from outside or due to outgassing inside or outside the light emitting diodes. In view of such deterioration, coating with a photocurable sealing agent, attachment of a transparent or opaque moisture absorbent, provision of frits to a substrate, on which an organic light emitting part is formed, or the like have been considered.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. A photocurable composition, comprising:
    a first photocurable monomer, the first photocurable monomer containing phosphorus and silicon;
    a second photocurable monomer, the second photocurable monomer being free of phosphorus and silicon, and containing an aromatic group; and
    a third photocurable monomer, the third photocurable monomer being free of phosphorus, silicon, and an aromatic group.

2. The photocurable composition as claimed in claim 1, wherein, when A represents a glass-metal alloy die shear strength in kgf between a glass substrate and a Ni/Fe alloy after curing, and B represents a curing shrinkage in % as determined by Equation 1, below, the photocurable composition has a value for A/B of about 0.7 kgf/% or more and the glass-metal alloy die shear strength is about 2.5 kgf or more, Curing shrinkage=|(Specific gravity of solid photocurable composition after curing)−(Specific gravity of liquid photocurable composition before curing)|/(Specific gravity of liquid photocurable composition before curing)×100.    <Equation 1>

3. The photocurable composition as claimed in claim 1, wherein the photocurable composition has a curing shrinkage of about 1% to about 10%.

4. The photocurable composition as claimed in claim 1, wherein the first photocurable monomer is represented by Formula 1:

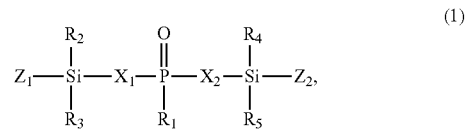

(1)

wherein, in Formula 1, $X_1$ and $X_2$ are each independently oxygen, sulfur, or —NR—, in which R is hydrogen or a $C_1$ to $C_{10}$ alkyl group;
$R_1$, $R_2$, $R_3$, $R_4$ and $R_5$ are each independently a substituted or unsubstituted $C_1$ to $C_{10}$ alkyl group, a substituted or unsubstituted $C_6$ to $C_{20}$ aryl group, a substituted or unsubstituted $C_3$ to $C_{10}$ cycloalkyl group, or a substituted or unsubstituted $C_7$ to $C_{21}$ arylalkyl group;
$Z_1$ and $Z_2$ are each independently hydrogen, a substituted or unsubstituted $C_1$ to $C_{10}$ alkyl group, a substituted or unsubstituted $C_6$ to $C_{20}$ aryl group, a substituted or unsubstituted $C_3$ to $C_{10}$ cycloalkyl group, a substituted or unsubstituted $C_7$ to $C_{21}$ arylalkyl group, or a group represented by Formula 2:

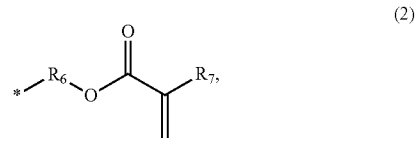

(2)

wherein, in Formula 2, "*" represents a binding site to a silicon atom of Formula 1, $R_6$ is a substituted or unsubstituted $C_1$ to $C_{10}$ alkylene group, a substituted or unsubstituted $C_6$ to $C_{20}$ arylene group, a substituted or unsubstituted $C_3$ to $C_{10}$ cycloalkylene group or a substituted or unsubstituted $C_7$ to $C_{21}$ arylalkylene group, and $R_7$ is hydrogen, or a methyl group; and at least one of $Z_1$ and $Z_2$ is the group represented by Formula 2.

5. The photocurable composition as claimed in claim 1, wherein the second photocurable monomer is represented by Formula 5:

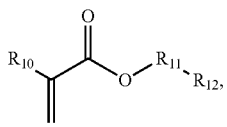

(5)

wherein, in Formula 5, $R_{10}$ is hydrogen or a methyl group; $R_{11}$ is a substituted or unsubstituted $C_1$ to $C_{10}$ aliphatic hydrocarbon group; and $R_{12}$ is a substituted or unsubstituted $C_6$ to $C_{40}$ aromatic hydrocarbon group.

6. The photocurable composition as claimed in claim 1, wherein the third photocurable monomer includes a polyalkylene glycol di(meth)acrylate.

7. The photocurable composition as claimed in claim 1, wherein the third photocurable monomer includes a mixture of a monofunctional monomer and a polyfunctional monomer.

8. The photocurable composition as claimed in claim 1, wherein the photocurable composition includes:
about 1 wt % to about 50 wt % of the first photocurable monomer,
about 1 wt % to about 50 wt % of the second photocurable monomer, and
about 1 wt % to about 90 wt % of the third photocurable monomer.

9. The photocurable composition as claimed in claim 1, wherein, in the photocurable composition:
a weight ratio of the second photocurable monomer to the first photocurable monomer is about 0.6 to about 4,
a weight ratio of the third photocurable monomer to the first photocurable monomer is about 1 to about 25, and
a weight ratio of the third photocurable monomer to the second photocurable monomer is about 2.5 to about 8.

10. The photocurable composition as claimed in claim 1, further comprising an initiator.

11. The photocurable composition as claimed in claim 10, wherein the photocurable composition includes:
about 1 wt % to about 50 wt % of the first photocurable monomer,
about 1 wt % to about 50 wt % of the second photocurable monomer,
about 1 wt % to about 97 wt % of the third photocurable monomer, and
about 0.1 wt % to about 10 wt % of the initiator.

12. The photocurable composition as claimed in claim 1, wherein:
the first photocurable monomer is represented by Formula 1:

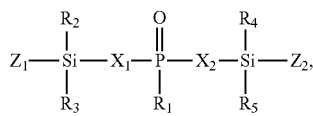

(1)

wherein, in Formula 1, $X_1$ and $X_2$ are each independently oxygen, sulfur, or —NR—, in which R is hydrogen or a $C_1$ to $C_{10}$ alkyl group;

$R_1$, $R_2$, $R_3$, $R_4$ and $R_5$ are each independently a substituted or unsubstituted $C_1$ to $C_{10}$ alkyl group, a substituted or unsubstituted $C_6$ to $C_{20}$ aryl group, a substituted or unsubstituted $C_3$ to $C_{10}$ cycloalkyl group, or a substituted or unsubstituted $C_7$ to $C_{21}$ arylalkyl group;

$Z_1$ and $Z_2$ are each independently hydrogen, a substituted or unsubstituted $C_1$ to $C_{10}$ alkyl group, a substituted or unsubstituted $C_6$ to $C_{20}$ aryl group, a substituted or unsubstituted $C_3$ to $C_{10}$ cycloalkyl group, a substituted or unsubstituted $C_7$ to $C_{21}$ arylalkyl group, or a group represented by Formula 2:

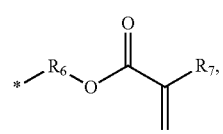

(2)

wherein, in Formula 2, "*" represents a binding site to a silicon atom of Formula 1, $R_6$ is a substituted or unsubstituted $C_1$ to $C_{10}$ alkylene group, a substituted or unsubstituted $C_6$ to $C_{20}$ arylene group, a substituted or unsubstituted $C_3$ to $C_{10}$ cycloalkylene group or a substituted or unsubstituted $C_7$ to $C_{21}$ arylalkylene group, and $R_7$ is hydrogen or a methyl group; and at least one of $Z_1$ and $Z_2$ is the group represented by Formula 2;

the second photocurable monomer is represented by Formula 5:

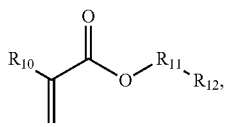

(5)

wherein, in Formula 5, $R_{10}$ is hydrogen or a methyl group; $R_{11}$ is a substituted or unsubstituted $C_1$ to $C_{10}$ aliphatic hydrocarbon group; and $R_{12}$ is a substituted or unsubstituted $C_6$ to $C_{40}$ aromatic hydrocarbon group; and the third photocurable monomer includes a polyalkylene glycol di(meth)acrylate.

13. The photocurable composition as claimed in claim 1, wherein:
the first photocurable monomer is represented by the following Formula 10:

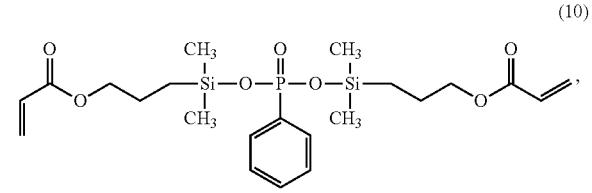 [SMILES: C=CC(=O)OCCC[Si](C)(C)OP(=O)(O[Si](C)(C)CCCOC(=O)C=C)c1ccccc1]

(10)

the second photocurable monomer is represented by the following Formula 11:

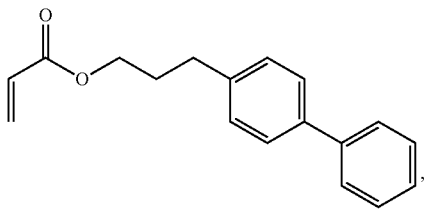

(11)

and the third photocurable monomer is represented by the following Formula 12:

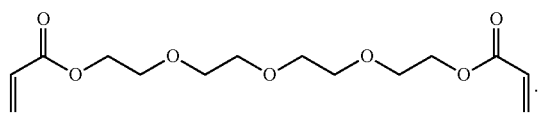

(12)

14. A composition for encapsulation of an organic light emitting diode comprising the photocurable composition as claimed in claim 1.

15. An encapsulated apparatus, comprising:
a member for the apparatus; and
a barrier stack on the member for the apparatus, the barrier stack including:
an inorganic barrier layer, and
an organic barrier layer, the organic barrier layer being prepared from the photocurable composition as claimed in claim 1.

16. The encapsulated apparatus as claimed in claim 15, wherein:
the inorganic barrier layer is formed of any one of a metal; a nonmetal; an oxide of a metal, a nonmetal, or mixtures thereof; a fluoride of a metal, a nonmetal, or mixtures thereof; a nitride of a metal, a nonmetal, or mixtures thereof; a carbide of a metal, a nonmetal, or mixtures thereof; an oxynitride of a metal, a nonmetal, or mixtures thereof; a boride of a metal, a nonmetal, or mixtures thereof; a silicide of a metal, a nonmetal, or mixtures thereof; an alloy of at least two metals; or an alloy of a metal and a nonmetal, and
the metal includes a post transition metal, a metalloid, a transition metal, or a lanthanide metal.

17. The encapsulated apparatus as claimed in claim 15, wherein the member for the apparatus includes an organic light emitting diode, an illumination device, a metal sensor pad, a microdisc laser, an electrochromic device, a photochromic device, a microelectromechanical system, a solar cell, an integrated circuit, a charge coupled device, or a light emitting diode.

18. The encapsulated apparatus as claimed in claim 15, wherein the organic barrier layer has a water vapor transmission rate of about 4.0 $g/m^2 \cdot 24$ hr or less, as measured on a 5 µm thick coating layer at 37.8° C. and 100% RH for 24 hours.

19. The encapsulated apparatus as claimed in claim 15, wherein the organic barrier layer has an outgassing amount of about 2,000 ppm or less.

20. The encapsulated apparatus as claimed in claim 13, wherein the organic barrier layer has a thickness of about 0.1 µm to about 20 µm.

* * * * *